(12) United States Patent
Kim

(10) Patent No.: US 8,164,080 B2
(45) Date of Patent: Apr. 24, 2012

(54) DIODE STRUCTURES AND RESISTIVE RANDOM ACCESS MEMORY DEVICES HAVING THE SAME

(75) Inventor: Young-bae Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 183 days.

(21) Appl. No.: 12/659,166

(22) Filed: Feb. 26, 2010

(65) Prior Publication Data

US 2010/0237315 A1 Sep. 23, 2010

(30) Foreign Application Priority Data

Mar. 23, 2009 (KR) .................. 10-2009-0024576

(51) Int. Cl.
*H01L 29/88* (2006.01)
(52) U.S. Cl. .................. 257/3; 257/49; 257/E29.339
(58) Field of Classification Search ................ 257/3, 49, 257/E29.339
See application file for complete search history.

(56) References Cited

U.S. PATENT DOCUMENTS

| 6,025,220 | A | 2/2000 | Sandhu | |
|---|---|---|---|---|
| 6,229,157 | B1 | 5/2001 | Sandhu | |
| 6,392,913 | B1 * | 5/2002 | Sandhu | 365/105 |
| 2002/0088989 | A1 | 7/2002 | Kim | |
| 2009/0008623 | A1 * | 1/2009 | Lim et al. | 257/4 |
| 2009/0184396 | A1 * | 7/2009 | Kim et al. | 257/536 |
| 2010/0110758 | A1 * | 5/2010 | Li et al. | 365/148 |

FOREIGN PATENT DOCUMENTS

| JP | 2000-150920 | 5/2000 |
|---|---|---|
| JP | 2001-068688 | 3/2001 |
| JP | 2004-055627 | 2/2004 |
| KR | 10-2005-0020297 | 3/2005 |
| KR | 10-2008-0057095 | 6/2008 |

* cited by examiner

*Primary Examiner* — Cuong Q Nguyen
*Assistant Examiner* — Tran Tran
(74) *Attorney, Agent, or Firm* — Harness, Dickey & Pierce, P.L.C.

(57) ABSTRACT

A diode structure includes: a lower electrode and an insulating layer disposed on the lower electrode. The insulating layer includes aperture exposing a portion of the lower electrode. The diode structure further includes: a first layer and a second layer. The first layer is disposed in the aperture and having a depressed portion. The second layer is disposed in the depressed portion of the first layer. A resistive random access memory (RRAM) device includes the above-described diode structure.

15 Claims, 8 Drawing Sheets

DIODE STRUCTURES AND RESISTIVE RANDOM ACCESS MEMORY DEVICES HAVING THE SAME

CROSS-REFERENCE TO RELATED APPLICATION(S)

This application claims priority under 35 U.S.C. §119 to Korean Patent Application No. 10-2009-0024576, filed on Mar. 23, 2009, in the Korean Intellectual Property Office, the disclosure of which is incorporated herein in its entirety by reference.

BACKGROUND

1. Field

One or more example embodiments relate to diode structures and resistive random access memory devices (RRAM) having the same.

2. Description of the Related Art

A relatively large number of memory devices including semiconductor memories have a switching structure. A dynamic random access memory (DRAM), which is a representative example of memory device, includes one switching structure and one capacitor. Example switching structures include transistors, diodes, and varistors.

A conventional switching structure requires a relatively small and relatively simple structure in order to fabricate a relatively high-density semiconductor device in which a relatively large amount of information is stored in a relatively small region. A conventional resistive random access memory (RRAM) device may be designed as a cross-point array having a one diode-one resistor (1D-1R) cell structure as a unit device, thereby increasing the integration degree thereof.

A diode that exhibits a relatively high current density, a relatively low leakage current (owing to a high ON/OFF ratio), and a relatively high reaction rate with respect to a pulse signal, may be employed in a semiconductor device to increase the degree of integration.

SUMMARY

One or more example embodiments provide diode structures having an increased effective area and resistive random access memory (RRAM) devices including the same.

According to one or more example embodiments, a diode structure includes: a lower electrode; an insulating layer disposed on the lower electrode; a first layer; and a second layer. The insulating layer has an aperture exposing a portion of the lower electrode. The first layer is disposed on the lower electrode exposed via the aperture, along sidewall and bottom surfaces of the aperture, and has a depressed portion. The second layer is disposed in the depressed portion.

According to at least some example embodiments, the diode structure further includes: a silicide layer and a tunneling layer. The silicide layer is disposed between the lower electrode and the first layer. The tunneling layer is disposed between the first and second layers. At least one of the first layer and the second layer may include at least one selected from the group including an n type semiconductor layer and a p type semiconductor layer. One of the first layer and the second layer may be formed of at least one selected from the group including a semiconductor material and metal.

According to one or more example embodiments, a resistive random access memory (RRAM) device includes: a lower electrode; an insulating layer disposed on the lower electrode; a first layer; a second layer; a memory resistance layer and an upper electrode. The insulating layer has an aperture exposing a portion of the lower electrode. The first layer is disposed on the lower electrode exposed via the aperture, along sidewall and bottom surfaces of the aperture, and having a depressed portion. The second layer is disposed in the depressed portion, and the memory resistance layer is disposed on the second layer.

According to at least one example embodiment, the resistive random access memory device further includes: an intermediate electrode disposed between the second layer and the memory resistance layer; and a spacer layer disposed on the memory resistance layer to contact the sidewall surfaces of the aperture in the insulating layer. In this example embodiment, the upper electrode is disposed on the memory resistance layer exposed via the spacer layer.

According to at least some example embodiments, the resistive random access memory device may further include: a spacer layer disposed on the second layer to contact the sidewall surfaces of the aperture through the insulating layer. The memory resistance layer may be disposed on the second layer exposed via the spacer layer. In another example embodiment, an intermediate layer may be disposed on the second layer exposed via the spacer layer. In this example, the memory resistance layer and the upper electrode may be disposed sequentially on the intermediate electrode.

The transition metal oxide may be formed of a material selected from the group including: a nickel (Ni) oxide, a titanium (Ti) oxide, a hafnium (Hf) oxide, a zirconium (Zr) oxide, a zinc (Zn) oxide, a tungsten (W) oxide, a cobalt (Co) oxide, a copper (Cu) oxide, or a niobium (Nb) oxide, and any mixtures thereof.

BRIEF DESCRIPTION OF THE DRAWINGS

Example embodiments will become apparent and more readily appreciated from the following description of the accompanying drawings in which.

DETAILED DESCRIPTION

Figure 1:
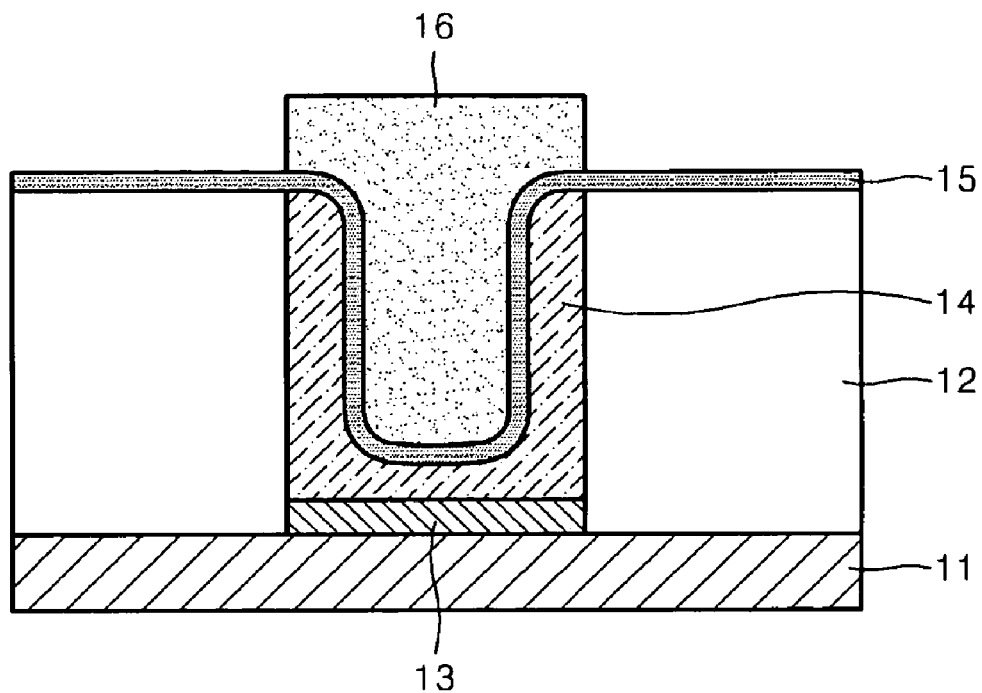
FIG. 1 is a cross-sectional view of a diode structure according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

It should be understood, however, that there is no intent to limit the general inventive concept to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

FIG. 1 is a cross-sectional view of a diode structure according to an example embodiment.

Referring to FIG. 1, an insulating layer 12 is disposed on a lower electrode 11. The insulating layer 12 has a hole-type aperture through which a portion of the lower electrode 11 is exposed. A three-dimensional (3D) diode structure is disposed on the exposed lower electrode 11. The diode structure is formed along the sidewalls and bottom of the aperture. The diode structure includes a first layer 14 and a second layer 16. The first layer 14 is formed in the aperture, and has a depressed portion. The second layer 16 is disposed in the depressed portion of the first layer 14.

According to one or more example embodiments, as shown in FIG. 1, a silicide layer 13 formed of a silicide material may be disposed between the lower electrode 11 and the first layer 14. Further, a tunnelling layer 15 may be disposed between the first and second layers 14 and 16.

In one example, the diode structure of FIG. 1 may be a P-N junction diode or a Schottky diode. For example, the first layer 14 and the second layer 16, which constitute the diode structure of FIG. 1, may be formed as a multi-layer (e.g., bi-layer) structure of an n-type semiconductor layer or a p-type semiconductor layer. In more detail, the diode structure of FIG. 1 may be a bi-layer structure formed, of n-type poly-silicon or p-type poly-silicon. Alternatively, the diode structure may be a bi-layer structure formed of an n-type oxide layer and a p-type oxide layer. When an oxide layer is formed of poly-silicon, an intrinsic layer may be added between the n-type poly-silicon layer and the p-type poly-silicon layer.

Alternatively, the diode structure of FIG. 1 may be a Schottky diode having a multi-layer (e.g., bi-layer) structure formed of a semiconductor material and metal. In this example, the first layer 14 may be silicon (Si) doped with impurities and the second layer 15 may be formed of metal or vice versa.

Still referring to the example embodiment shown in FIG. 1, the lower electrode 11 may be formed of a silicide, poly-silicon doped with impurities, metal, or a conductive metal oxide. The insulating layer 12 may be formed of a general insulating material, such as, $SiO_2$, $Si_3N_4$, etc. The silicide layer 13 may be selectively formed to reduce contact resistance between a diode and an electrode. The silicide layer 13 may be formed of various metal silicide materials such as cobalt (Co), chromium (Cr), molybdenum (Mo), tantalum (Ta), titanium (Ti), nickel (Ni), tungsten (W), etc. The tunneling layer 15 may be selectively formed to improve an ON/OFF ratio by reducing an 'off' current of the diode structure. The tunneling layer 15 may be formed of various oxides or dielectric materials. In more detail, for example, the tunneling layer 15 may be formed of Si, or an insulating metal oxide such as a Si oxide, a Si nitride, an Al oxide, a hafnium (Hf) oxide, a zirconium (Zr) oxide, etc.

FIGS. 2A through 2E are cross-sectional views illustrating an example embodiment of a method of fabricating a diode structure, which does not include a tunnelling layer.

Figure 2A:
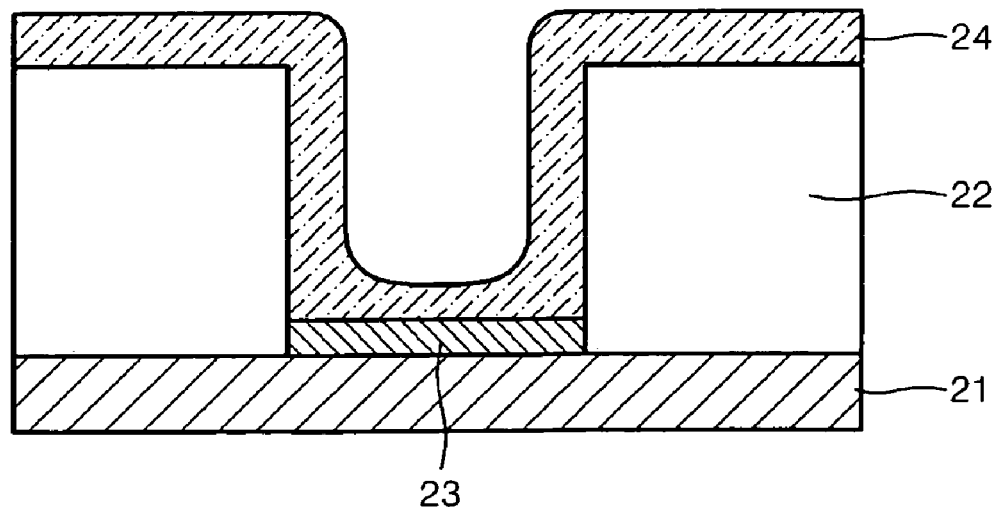
FIGS. 2A through 2E are cross-sectional views illustrating an example embodiment of a method of fabricating a diode structure, which does not include a tunnelling layer.

Referring to FIG. 2A, an insulating layer 22 is formed by applying an insulating material onto a lower electrode 21. A hole-type aperture is formed through a portion of the insulating layer 22 to expose a portion of the lower electrode 21. A silicide layer 23 is formed by selectively applying metal onto the exposed lower electrode 21.

A first layer 24 is formed along the sidewalls and bottom of the aperture through the insulating layer 22. As described above, the diode structure may be a P-N junction diode, an oxide diode, or a Schottky diode. If the diode structure is a Schottkey diode, the first layer 24 may be obtained by applying, for example, Si doped with impurities, a metal material or a metal silicide material.

Figure 2B:
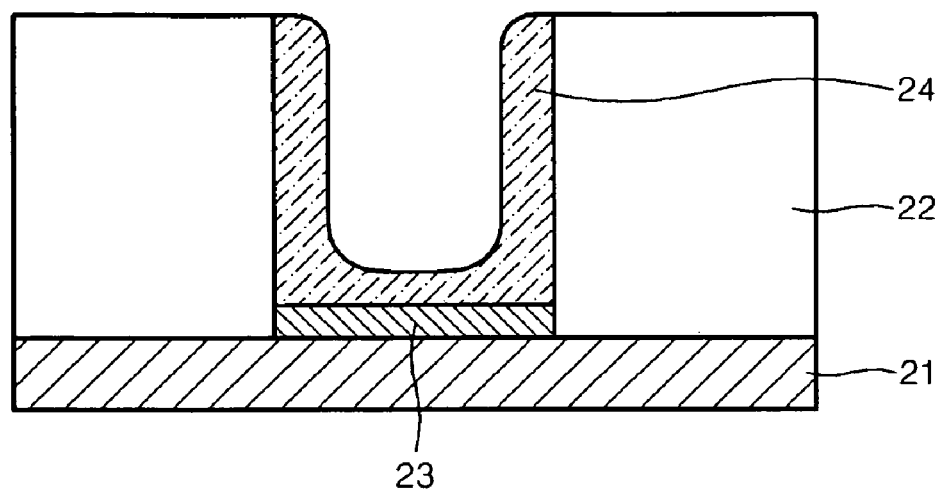

Referring to FIG. 2B, the first layer 24 is partially removed from the upper surface of the insulating layer 22 by performing a planarization process using, for example, chemical mechanical polishing (CMP). The first layer 24 remains on the sidewalls and bottom of the aperture through the insulating layer 22 and either on the exposed lower electrode 21 or on the silicide layer 23 when the silicide layer 23 is obtained. The remaining first layer 24 has a depressed portion having bottom and sidewall surfaces.

Figure 2C:
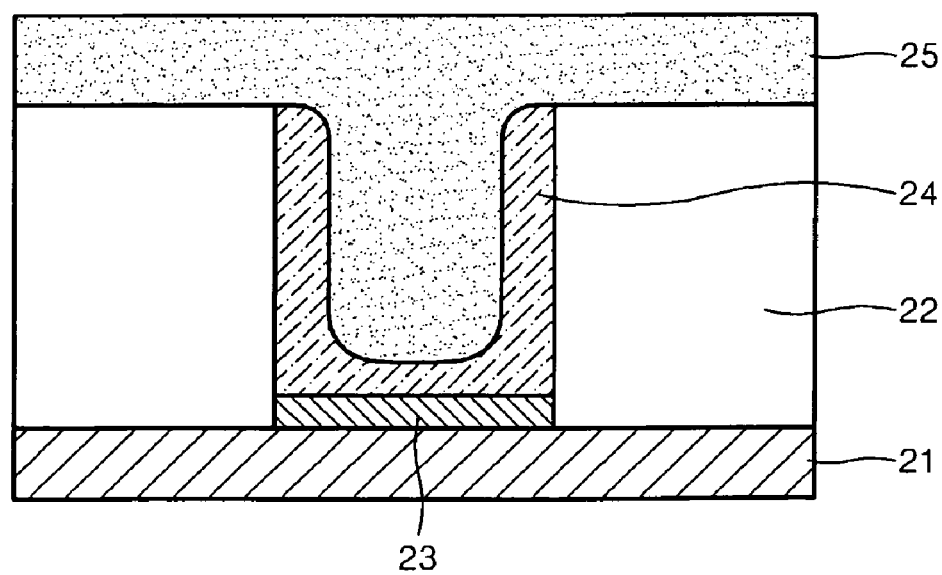

Referring to FIG. 2C, a second layer 25 is formed to fill the depressed portion, cover the top surface of the remaining first layer 24 and cover at least a portion of the top surface of the insulating layer 22. In the case of a Schottky diode, the second layer 25 may be formed of, for example, a metal material, a metal silicide material, or Si doped with impurities. If the first layer 24 is formed of Si doped with impurities, the second layer 25 may be formed of metal or a metal silicide. If the first layer 24 is formed of metal or a metal silicide, the second layer 25 may be formed of Si doped with impurities.

Figure 2D:
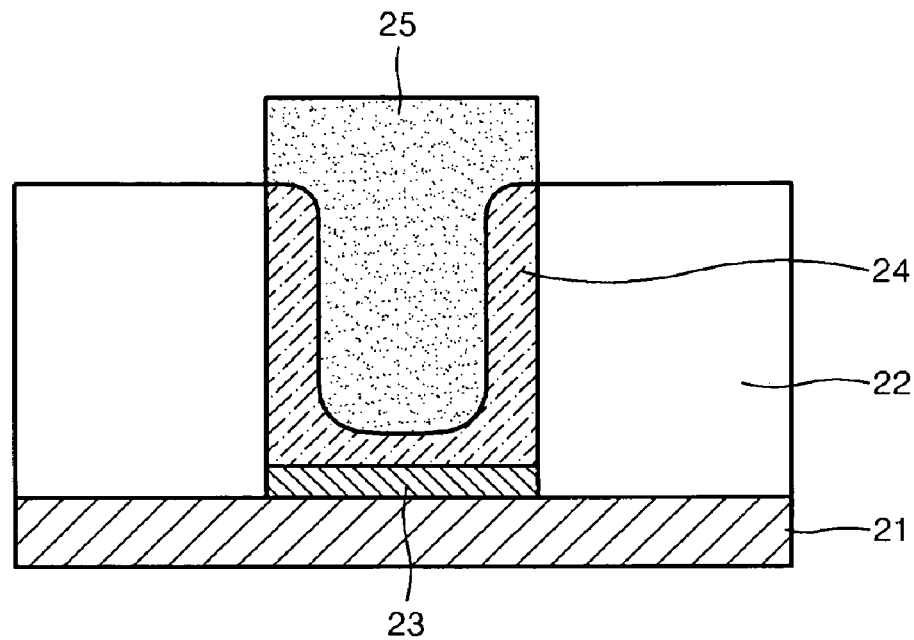

Referring to FIG. 2D, the second layer 25 is removed from the top surface of the insulating layer 22 using an etching process.

Figure 2E:
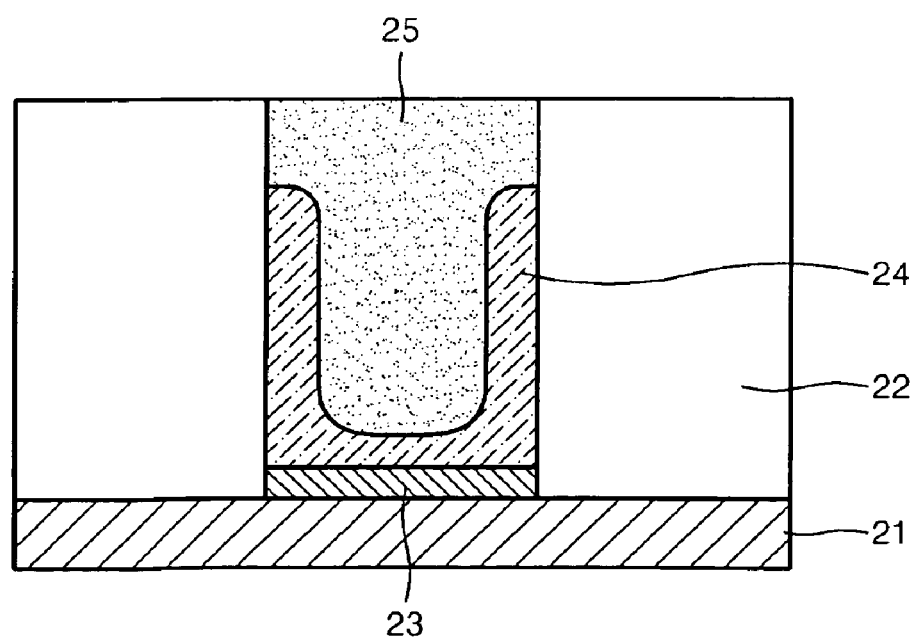

Referring FIG. 2E, an insulating material is selectively applied onto the residual second layer 25 and the upper surface of the insulating layer 22. The resultant structure is planarized using, for example, CMP to form the diode structure.

FIGS. 3A through 3E are cross-sectional views illustrating another example embodiment of a method of fabricating a diode structure including a tunnelling layer.

Figure 3A:
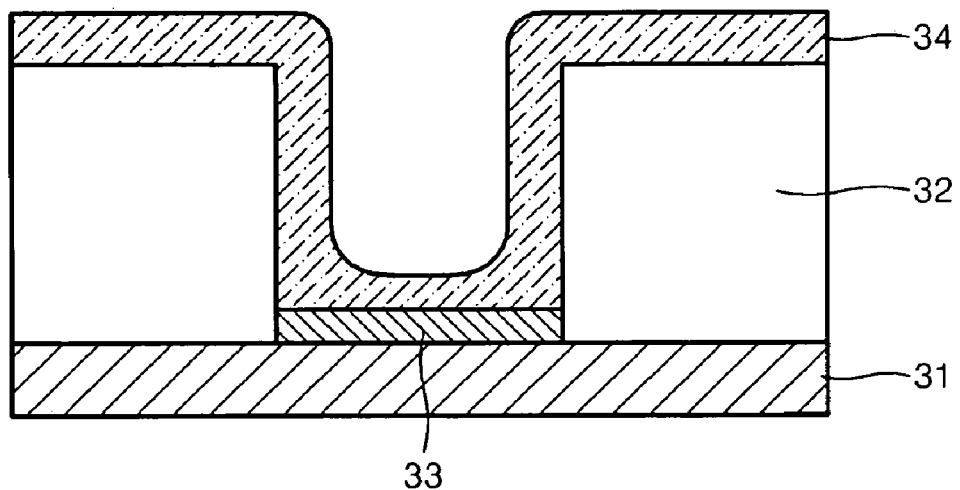
FIGS. 3A through 3E are cross-sectional views illustrating an example embodiment of a method of fabricating a diode structure including a tunnelling layer.

Referring to FIG. 3A, an insulating layer 32 is formed on a lower electrode 31 and a hole-type aperture is formed through a portion of the insulating layer 32 to expose a portion of the lower electrode 31. Metal is selectively applied onto the exposed portion of the lower electrode 31 to form a silicide layer 33. A first layer 34 is formed along the sidewalls and bottom of the aperture and to cover at least a portion of a top surface of the insulating layer 32. If the diode structure is a Schottky diode, the first layer 24 may be formed by applying, for example, Si doped with impurities, a metal material or a metal silicide material.

Figure 3B:
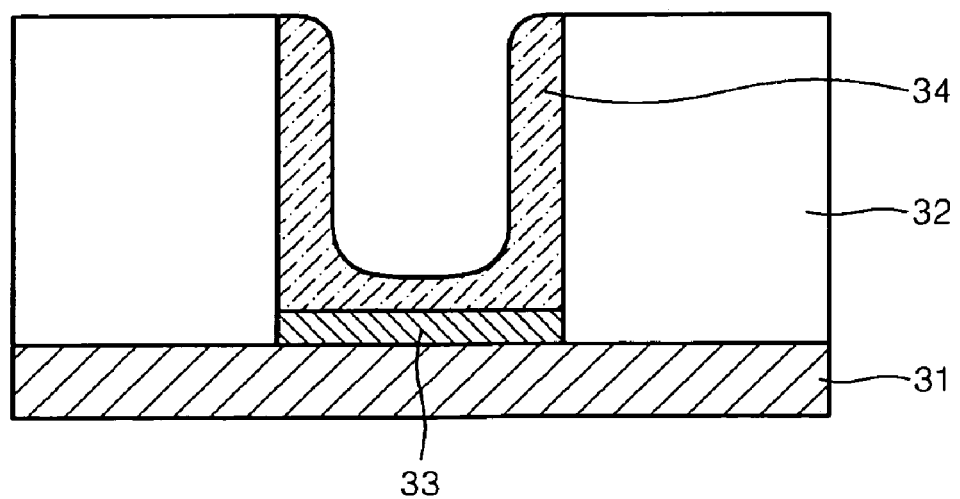

Referring to FIG. 3B, the first layer 34 is partially removed from the top surface of the insulating layer 32 by performing a planarization process using, for example, CMP. The residual first layer 34 remains on the sidewalls and bottom of the aperture, and either the exposed lower electrode 31 or the silicide layer 33 when the silicide layer 33 is present. The resultant first layer 34 has a depressed portion having bottom and sidewall surfaces.

Figure 3C:
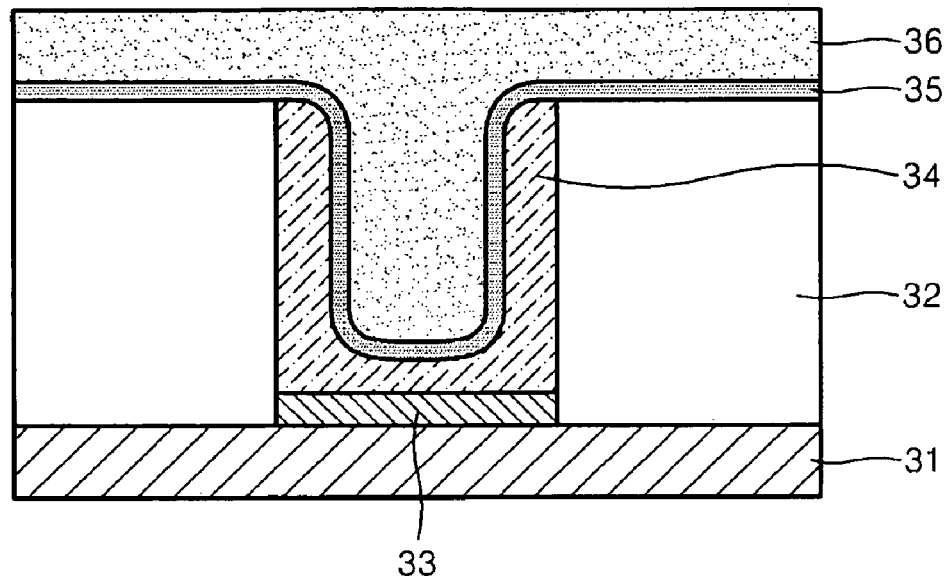

Referring to FIG. 3C, a tunnelling layer 35 is formed on the insulating layer 32 and the residual first layer 34 having the depressed portion. A second layer 36 is then formed on the tunnelling layer 35. In the case of a Schottky diode, the second layer 36 may be formed of, for example, a metal material, a metal silicide material, or Si doped with impurities. If the first layer 34 is formed of Si doped with impurities, the second layer 36 may be formed of a metal material or a metal silicide material. If the first material 34 is formed of a metal material or a metal silicide material, the second material 36 may be formed of Si doped with impurities.

Figure 3D:
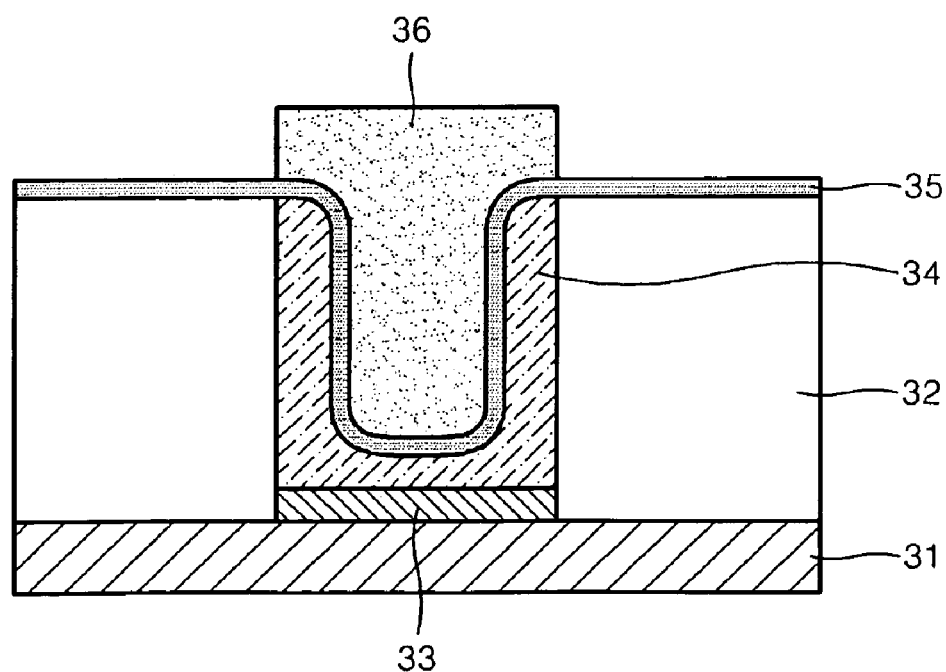
Figure 3E:
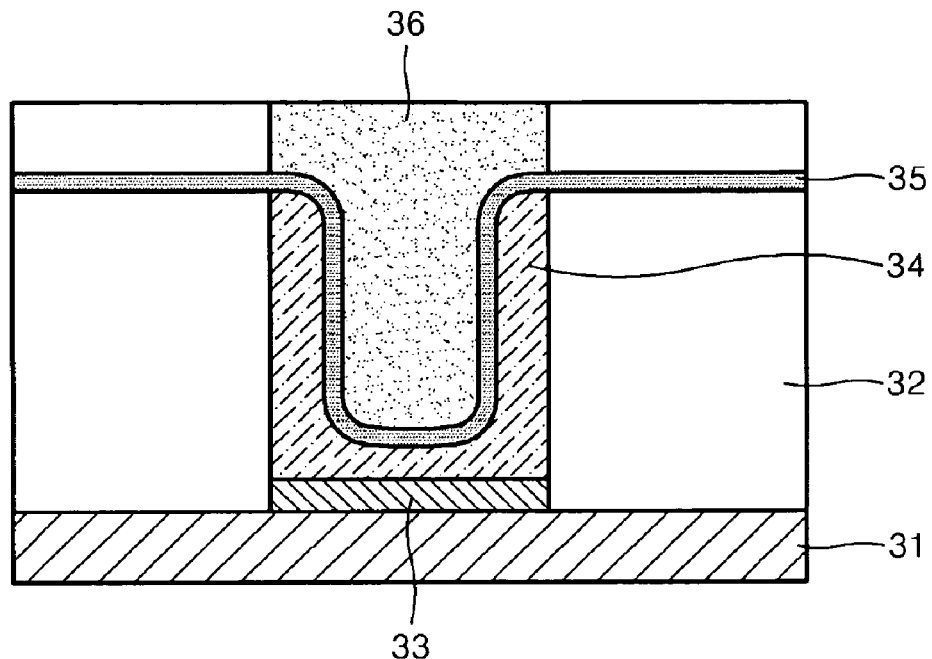

Referring to FIGS. 3D and 3E, a portion of the second layer 36 formed on the upper surface of tunnelling layer 35 above the insulating layer 32 is removed using an etching process. Alternatively, the insulating layer 32 may be exposed by removing a portion of the second layer 36 formed above the insulating layer 32 or by partially removing the second layer 36 together with the tunnelling layer 35. An insulating material is applied on the residual second layer 36 and the tunnelling layer 35 or insulating layer. A planarization process is performed on the resultant structure using, for example, CMP to expose the residual second layer 36 and form the diode structure.

Alternatively, the insulating layer 32 may be exposed by removing the tunnelling layer 35 while removing a portion of the second layer 36 formed above the insulating layer 32 using the etching process.

FIGS. 4 through 7 are cross-sectional views of a resistive random access memory (RRAM) having a diode structure according to one or more example embodiments. In FIGS. 4 through 7, a silicide layer 43, a tunnelling layer 45, and an intermediate electrode 47 are optional, and thus, may be omitted.

Figure 4:
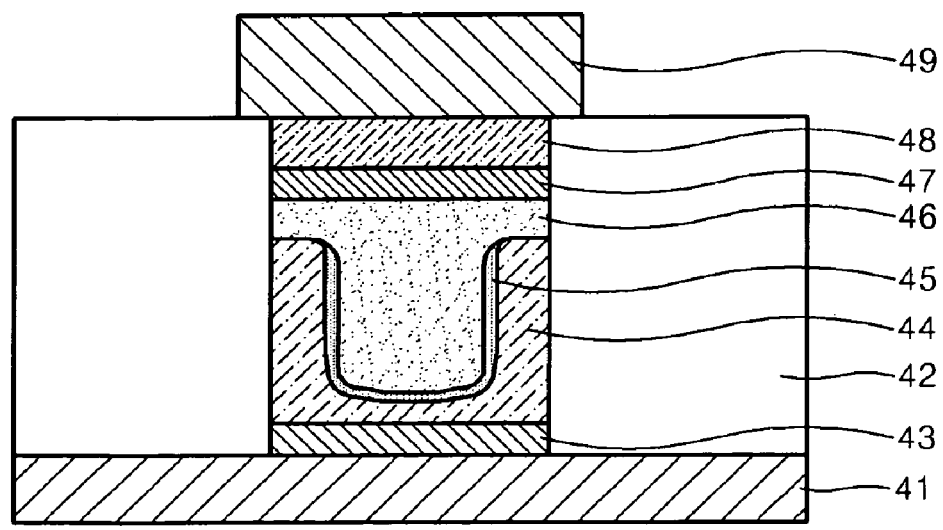
FIGS. 4 through 7 are cross-sectional views of a resistive random access memory (RRAM) device having a diode structure according to example embodiments.

Referring to FIG. 4, an insulating layer 42 is disposed on a lower electrode 41. The insulating layer 42 has a hole-type aperture exposing a portion of the lower electrode 41. A diode structure is disposed on the exposed portion of the lower electrode 41. The diode structure may be formed along the bottom and sidewall surfaces of the aperture. If the diode structure is formed along the bottom and sidewall surfaces of the aperture, the diode structure includes a first layer 44 and a second layer 46. The first layer 44 has a depressed portion and the second layer 46 is disposed in the depressed portion. According to at least one alternative example embodiment, a silicide layer 43 may be disposed between the lower electrode 41 and the first layer 44, and a tunnelling layer 45 may be disposed between the first layer 44 and the second layer 46.

Still referring to FIG. 4, an intermediate electrode 47 may be disposed on the second layer 46. A memory resistance layer 48 and an upper electrode 49 may be disposed on the intermediate electrode 47.

According to at least the example embodiment shown in FIG. 4, the intermediate electrode 47 and the upper electrode 49 may be formed of, for example, poly Si doped with impurities, metal, a conductive metal oxide, a precious metal, such as platinum (Pt), etc. The memory resistance layer 48 may be formed of, for example, a variable resistance material having multiple or variable resistance characteristics. In one example, the variable resistance material may be a transition metal oxide such as a nickel (Ni) oxide, a titanium (Ti) oxide, a hafnium (Hf) oxide, a zirconium (Zr) oxide, a zinc (Zn) oxide, a tungsten (W) oxide, a cobalt (Co) oxide, a copper (Cu) oxide, or a niobium (Nb) oxide, and any mixture thereof, having two or more resistance characteristics.

Figure 5:
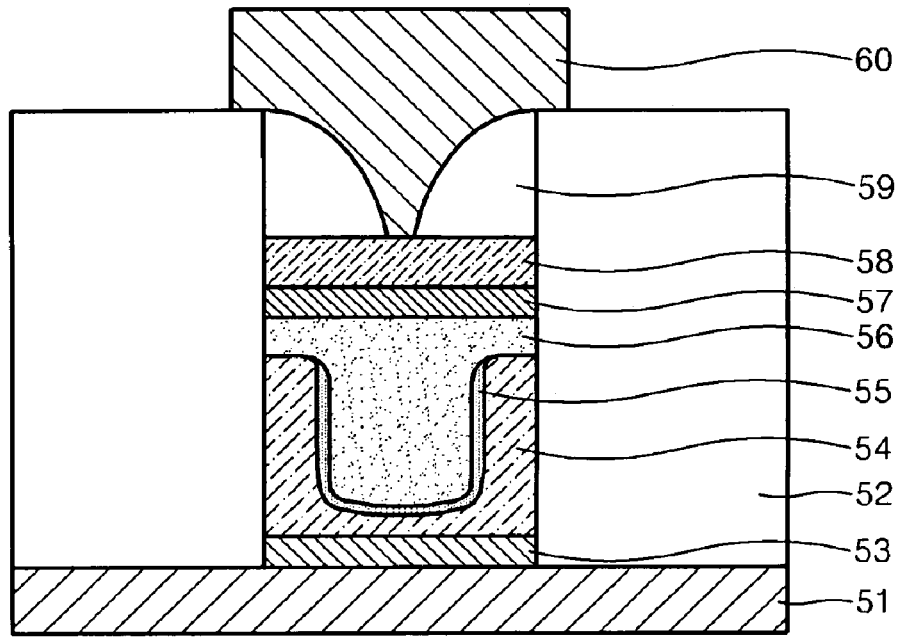

FIG. 5 illustrates an RRAM according to another example embodiment. In the example embodiment shown in FIG. 5, a contact area between an upper electrode 60 and the memory resistance layer 58 is reduced, thereby increasing the density of current supplied to a memory resistance layer 58.

Referring to FIG. 5, an insulating layer 52 is disposed on a lower electrode 51. A hole-type aperture is formed through the insulating layer 52 exposing a portion of the lower electrode 51. A diode structure is disposed on the exposed portion of the lower electrode 51. The diode structure is formed along the sidewalls and bottom of the aperture. The diode structure includes a first layer 54 and a second layer 56. The first layer 54 has a depressed portion. The second layer 56 is disposed in the depressed portion of the first layer 54.

In an alternative example embodiment, a silicide layer 52 may be disposed between the lower electrode 51 and the first layer 54, and a tunneling layer 55 may be disposed between the first layer 54 and the second layer 56.

Still referring to FIG. 5, an intermediate electrode 57 and the memory resistance layer 58 are disposed on the second layer 56. If the intermediate electrode 57 is omitted, the memory resistance layer 58 may be disposed directly on the second layer 56. A spacer layer 59 is disposed on the memory resistance layer 58 to contact side surfaces of the insulating layer 52. The spacer layer 59 is formed such that a portion of the memory resistance layer 58 is exposed. The upper electrode 60 is disposed on the exposed portion of the memory resistance layer 58 and on the spacer layer 59. In this example, the spacer layer 59 may be formed of an insulating material such as an oxide or a nitride.

Figure 6:
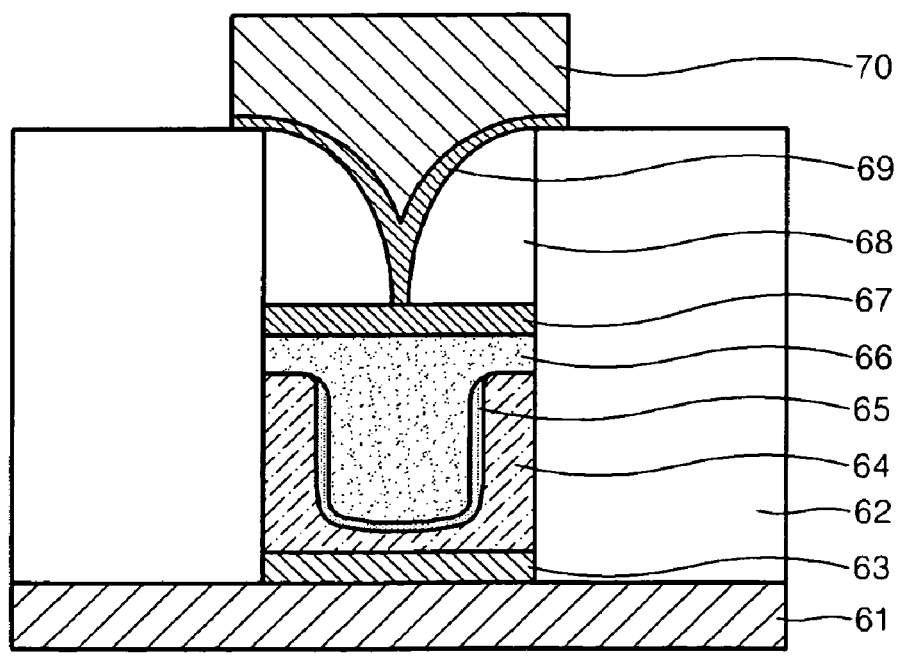

FIG. 6 illustrates an RRAM according to yet another example embodiment. In this example embodiment, the density of current supplied to a memory resistance layer 69 is increased by reducing a contact area between the memory resistance layer 69 and an intermediate electrode 67. Alternatively, when the intermediate electrode 67 is omitted the density of current supplied to a memory resistance layer 69 is increased by reducing a contact area between the memory resistance layer 69 and a second layer 66.

Referring to FIG. 6, an insulating layer 62 is disposed on a lower electrode 61. A hole-type aperture is formed through the insulating layer 62 to expose a portion of the lower electrode 61. A diode structure is disposed on the exposed portion of the lower electrode 61. The diode structure is formed along the sidewall and bottom surfaces of the aperture. The diode structure includes a first layer 64 and a second layer 66. The first layer 64 has a depressed portion. The second layer 66 is disposed in the depressed portion of the first layer 64. In this example embodiment, a silicide layer 63 is disposed between the lower electrode 61 and the first layer 64, and a tunneling layer 65 is disposed between the first layer 64 and the second layer 66. An intermediate electrode 67 is disposed on the second layer 66. When the intermediate layer 67 is formed, a spacer layer 68 is disposed on the intermediate layer 67 to contact the sidewall surfaces of the aperture in the insulating layer 62. The spacer layer 68 is formed such that a portion of the second layer 66 (or the intermediate layer 67 if present) is exposed.

As discussed above with regard to other example embodiments, the silicide layer 63, the tunneling layer 65, and/or the intermediate layer 67 may be omitted.

Still referring to FIG. 6, a memory resistance layer 69 is disposed on the exposed portion of the second layer 66 (or the intermediate layer 67 if present) and the spacer layer 68. An upper electrode 70 is disposed on the memory resistance layer 69.

Figure 7:
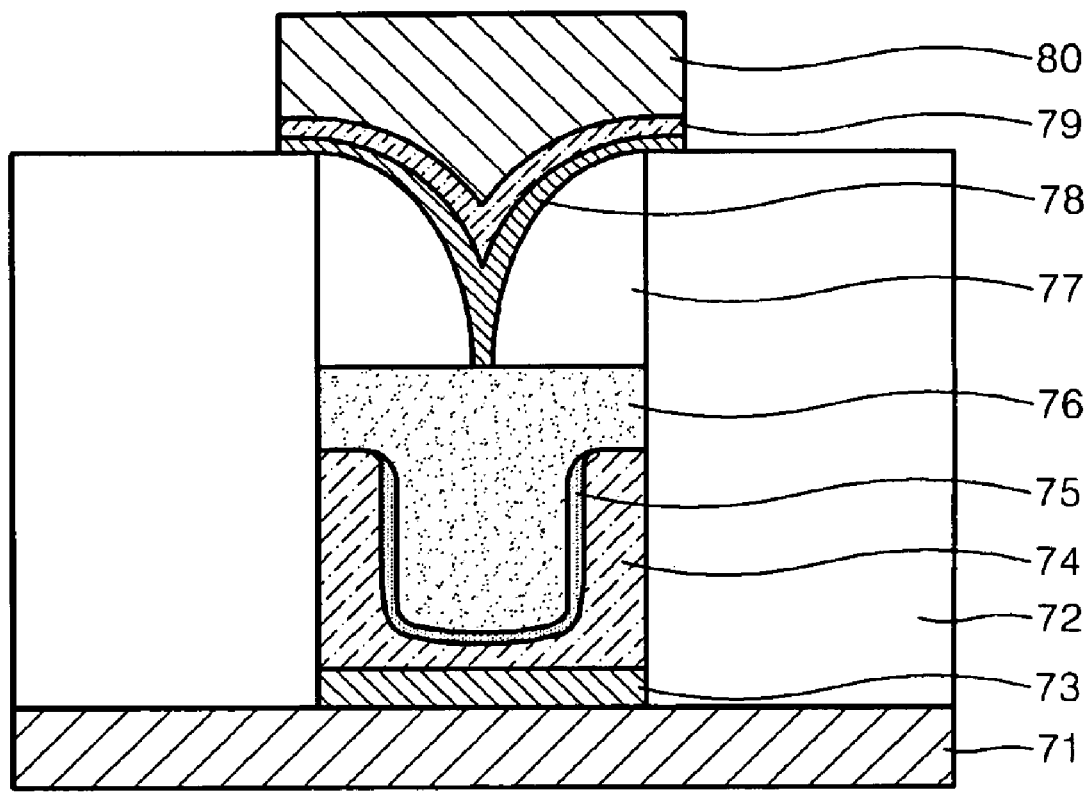

FIG. 7 illustrates an RRAM according to another example embodiment. In this example embodiment, the density of current supplied to a memory resistance layer 79 increases because a contact area between a second layer 76 and an intermediate electrode 78 is reduced.

Referring to FIG. 7, an insulating layer 72 is disposed on a lower electrode 71.

A hole-type aperture is formed through the insulating layer 72 to expose a portion of the lower electrode 71. A diode structure is disposed on the exposed portion of the lower electrode 71. The diode structure is formed along the sidewall and bottom surfaces of the aperture. The diode structure includes a first layer 74 and a second layer 76. The first layer 74 has a depressed portion and the second layer 76 is disposed in the depressed portion. According to at least this example embodiment, a silicide layer 73 is disposed between the lower electrode 71 and the first layer 74, and a tunneling layer 75 is disposed between the first and second layers 74 and 76. A spacer layer 77 is disposed on the second layer 76 to contact the sidewall surfaces of the aperture in the insulating layer 72. The spacer layer 77 is formed such that a portion of the second layer 74 is exposed. An intermediate layer 78 is disposed on the exposed portion of the second layer 76 and on the spacer layer 77. A memory resistance layer 79 and an upper electrode 80 are sequentially disposed on the intermediate layer 78.

As discussed above with regard to other example embodiments, the silicide layer 73, the tunneling layer 75, and/or the intermediate layer 78 may be omitted.

As described above, according to one or more example embodiments, a diode structure with an increased effective area and an RRAM device including the same may be manufactured by constructing a diode structure three-dimensionally as described herein.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A diode structure comprising:
   a lower electrode;
   an insulating layer disposed on the lower electrode, the insulating layer having an aperture exposing a portion of the lower electrode;
   a first layer disposed on the exposed portion of the lower electrode and along sidewall and bottom surfaces of the aperture, the first layer having a depressed portion; and
   a second layer disposed in the depressed portion of the first layer.

2. The diode structure of claim 1, further comprising:
   a silicide layer disposed between the lower electrode and the first layer.

3. The diode structure of claim 1, further comprising:
   a tunneling layer disposed between the first layer and the second layer.

4. The diode structure of claim 1, wherein one of the first layer and the second layer comprises:
   at least one of an n-type semiconductor layer and a p-type semiconductor layer.

5. The diode structure of claim 1, wherein one of the first layer and the second layer is formed of poly-silicon or an oxide semiconductor.

6. The diode structure of claim 1, wherein one of the first layer and the second layer is formed of a material selected from the group including a semiconductor material, metal, metal silicide, and any mixture thereof.

7. A resistive random access memory device comprising:
   a lower electrode;
   an insulating layer disposed on the lower electrode, the insulating layer having an aperture exposing a portion of the lower electrode;
   a first layer disposed on the exposed portion of the lower electrode and along sidewall and bottom surfaces of the aperture, the first layer having a depressed portion;
   a second layer disposed in the depressed portion of the first layer;
   a memory resistance layer disposed on the second layer; and
   an upper electrode disposed on the memory resistance layer.

8. The resistive random access memory device of claim 7, further comprising:
   a silicide layer disposed between the lower electrode and the first layer.

9. The resistive random access memory device of claim 7, further comprising:
   a tunneling layer disposed between the first layer and the second layer.

10. The resistive random access memory device of claim 7, further comprising:
    an intermediate electrode disposed between the second layer and the memory resistance layer.

11. The resistive random access memory device of claim 7, further comprising:
    a spacer layer disposed on the memory resistance layer to contact the sidewall surfaces of the aperture through the insulating layer and such that a portion of the memory resistance layer is exposed; wherein
    the upper electrode is disposed on the exposed portion of the memory resistance layer.

12. The resistive random access memory device of claim 7, further comprising:

a spacer layer disposed on the second layer to contact the sidewall surfaces of the aperture in the insulating layer and such that a portion of the second layer is exposed; wherein the memory resistance layer is disposed on the exposed portion of the second layer.

13. The resistive random access memory device of claim 7, further comprising:

a spacer layer disposed on the second layer to contact the sidewall surfaces of the aperture through the insulating layer and such that a portion of the second layer is exposed; and an intermediate layer disposed on the exposed portion of the second layer exposed; wherein the memory resistance layer and the upper electrode are sequentially disposed on the intermediate electrode.

14. The resistive random access memory device of claim 7, wherein the memory resistance layer is formed of a transition metal oxide.

15. The resistive random access memory device of claim 14, wherein the transition metal oxide is formed of a material selected from the group including a nickel (Ni) oxide, a titanium (Ti) oxide, a hafnium (Hf) oxide, a zirconium (Zr) oxide, a zinc (Zn) oxide, a tungsten (W) oxide, a cobalt (Co) oxide, a copper (Cu) oxide, or a niobium (Nb) oxide, and any mixture thereof.

* * * * *